US009755602B2

(12) United States Patent
Brunner et al.

(10) Patent No.: US 9,755,602 B2
(45) Date of Patent: Sep. 5, 2017

(54) BROADBAND MICROWAVE VARIABLE GAIN UP-CONVERTER

(71) Applicants: Analog Devices Technology, Hamilton (BM); Analog Devices, Inc., Norwood, MA (US)

(72) Inventors: Eberhard Brunner, Waakirchen (DE); Jeff Venuti, Bedford, MA (US)

(73) Assignees: ANALOG DEVICES TECHNOLOGY, Hamilton (BM); ANALOG DEVICES, INC., Norwood, MA (US)

( * ) Notice: Subject to any disclaimer, the term of this patent is extended or adjusted under 35 U.S.C. 154(b) by 351 days.

(21) Appl. No.: 14/258,634

(22) Filed: Apr. 22, 2014

(65) Prior Publication Data

US 2015/0303887 A1 Oct. 22, 2015

(51) Int. Cl.
| H04B 1/04 | (2006.01) |
| H03G 3/30 | (2006.01) |
| H03F 3/19 | (2006.01) |
| H03F 3/45 | (2006.01) |
| H03G 1/00 | (2006.01) |
| H03C 1/62 | (2006.01) |

(52) U.S. Cl.
CPC .............. *H03G 3/3042* (2013.01); *H03F 3/19* (2013.01); *H03F 3/4508* (2013.01); *H03G 1/0023* (2013.01); *H03F 2200/336* (2013.01); *H03F 2200/451* (2013.01); *H03F 2203/45116* (2013.01); *H03F 2203/45154* (2013.01); *H03F 2203/45306* (2013.01)

(58) Field of Classification Search
CPC .............. H04B 1/04; H04B 2001/0408; H04B 2001/0416; H04B 2001/0491
USPC .............................. 455/118, 127.2; 375/295
See application file for complete search history.

(56) References Cited

U.S. PATENT DOCUMENTS

| 4,837,530 | A | 6/1989 | Kondoh |
| 5,684,431 | A * | 11/1997 | Gilbert ..................... H03G 7/06 330/254 |
| 6,046,640 | A | 4/2000 | Brunner |
| 6,349,216 | B1 * | 2/2002 | Alberth et al. ............ 455/550.1 |
| 7,382,190 | B2 | 6/2008 | Gilbert |
| 8,111,776 | B1 * | 2/2012 | Crawford ...................... 375/295 |
| 8,195,117 | B2 * | 6/2012 | Bult et al. .................. 455/234.1 |
| 2007/0201581 | A1 * | 8/2007 | Wagh et al. .................. 375/308 |
| 2008/0139123 | A1 * | 6/2008 | Lee et al. ...................... 455/63.1 |
| 2010/0158084 | A1 * | 6/2010 | Voinigescu .............. H04B 1/40 375/219 |

* cited by examiner

*Primary Examiner* — Lee Nguyen
(74) *Attorney, Agent, or Firm* — Patent Capital Group

(57) ABSTRACT

A system has a baseband gain stage to receive incoming in-phase and quadrature voltage signals and output in-phase and quadrature current signals, a mixer core arranged to receive the in-phase and quadrature current signals and output radio frequency signals, and a variable gain amplifier to receive the radio frequency signals and produce a broadband radio signal.

21 Claims, 4 Drawing Sheets

BROADBAND MICROWAVE VARIABLE GAIN UP-CONVERTER

BACKGROUND

Up-converters generally take lower frequency signals and convert them to higher frequencies. Often, these up-converted signals need to have their power varied, depending upon their initial power and frequency. A variable gain function generally produces the needed power change.

Implementation of a variable gain function at microwave frequencies can present some issues. At microwave frequencies, such as in the range of 6 to 24 GHz, the two octave frequency span is large enough such that traditional narrowband techniques cannot easily be used. The resulting design therefore must provide a broadband range.

At microwave frequencies, designs need to minimize parasitic elements, in particular capacitance. Typically, one would implement an attenuator in a ladder fashion. However, this type of structure has too much capacitance because of the repetitive resistor network.

U.S. Pat. No. 4,837,530 illustrates one approach that uses a voltage variable attenuator (VVA). At a minimum this requires buffering at the output to achieve any gain. In addition, the outputs of these circuits are normally controlled to be linear-in-volts. Linear-in-volts controls make the use of adjustable gain controls difficult without some added translation to linear-in-dB.

Another approach, discussed in U.S. Pat. No. 7,382,190, uses a two-stage interpolator. For example, the interpolator shown in FIG. 5 drives what is called the signal steering core. The signal steering core together with the current mirror and resistors RC in FIG. 5 of the Gilbert patent comprise the second stage of the interpolator. From a noise and impedance standpoint, using a 2-stage interpolator may be less than ideal at microwave frequencies.

DETAILED DESCRIPTION OF THE EMBODIMENTS

Figure 1:
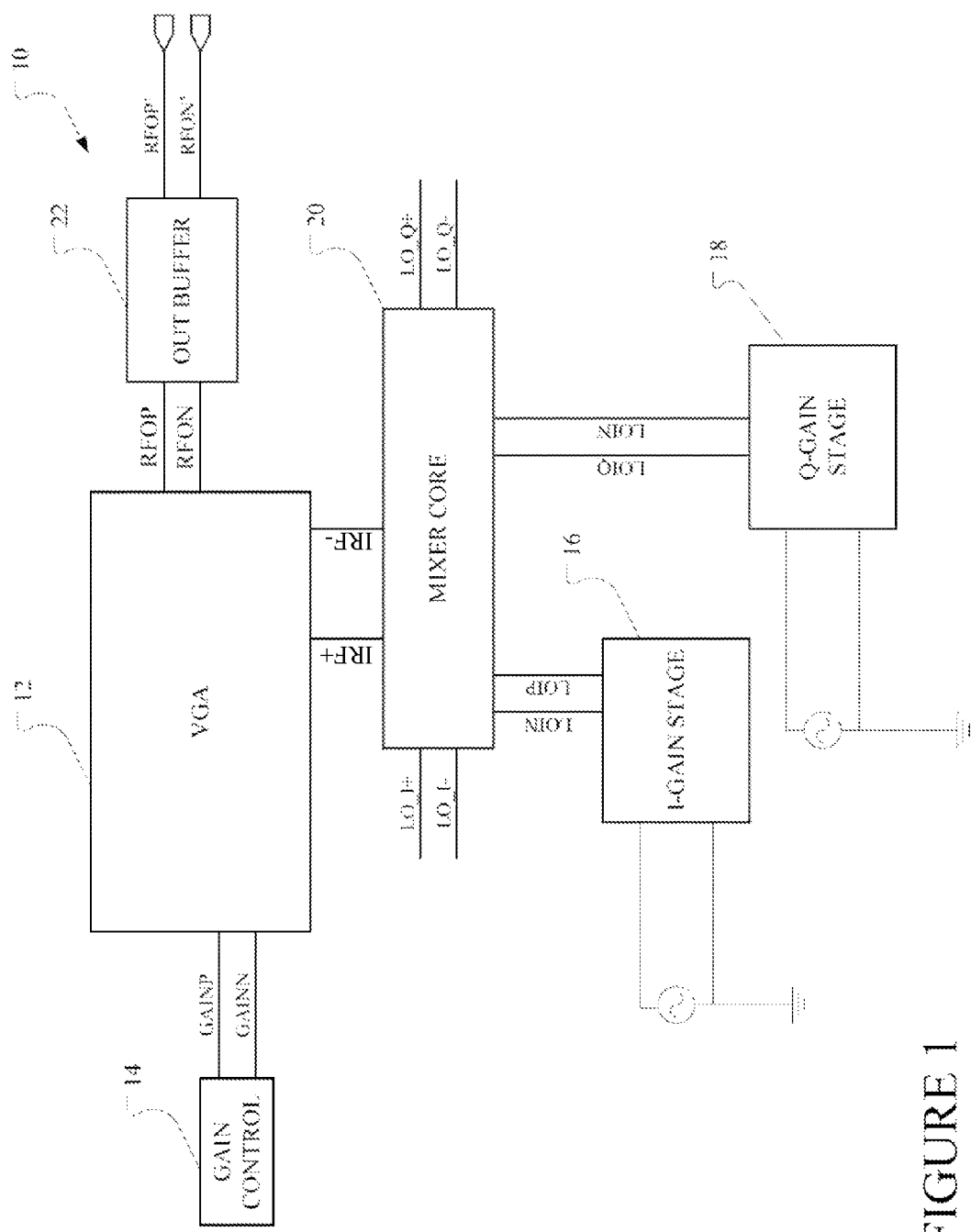
FIG. 1 shows a system diagram of an embodiment of a variable gain up-converter at microwave frequencies.

FIG. 1 shows a linear-in-dB broadband up-converter 10. In the embodiment of FIG. 1, a baseband signal is received as an in-phase "I" signal and a quadrature "Q" signal by the I and Q gain stages 16 and 18. For purposes of this discussion, a baseband signal has a frequency in the range of 0, or DC, to 2 Gigahertz (GHz), and a broadband microwave (RF) output signal has a range of 6 to 24 GHz. These baseband stages convert the input voltages of these signals into current form. These currents are then provided to a mixer core 20.

In one embodiment, the mixer core 20 consists of two double-balanced Gilbert cell mixer cores. The mixer core 20 produces differential current signals shown as IRF− and IRF+ that becomes an input to the variable gain amplifier (VGA) 12. The gain control 14 for the VGA 12 provides a differential voltage as GAINP and GAINN to the VGA 12. As will be discussed in more detail later, the differential gain voltages steer the signal currents in the VGA 12 to an attenuator network via an integrated interpolator within the VGA 12. The interpolator is referred to here as integrated, as it is a part of the VGA 12, rather than a separate interpolator as used in other approaches having a two-stage interpolator with a separate steering core.

The VGA 12 produces a differential radio frequency (RF) signal as RFOP and RFON One advantage of the embodiment here lies in the possible elimination of an output buffer/amplifier. If the output power/signal level is adequate for the application in which it is being used, the output can be taken directly at the 0 dB point of the attenuator. Generally, all one would need is an alternating current (AC) coupling capacitor and signal routing to an external load. The VGA 12 can produce a broadband output match with good return loss. If the external load requires higher power, one can add a buffer such as 22 to the output of the VGA 12. The output of the VGA 12 is differential, so a differential buffer amplifier would be used. The buffer output signal RFOP' and RFON' are 'primed' to show that they have been amplified.

Figure 2:
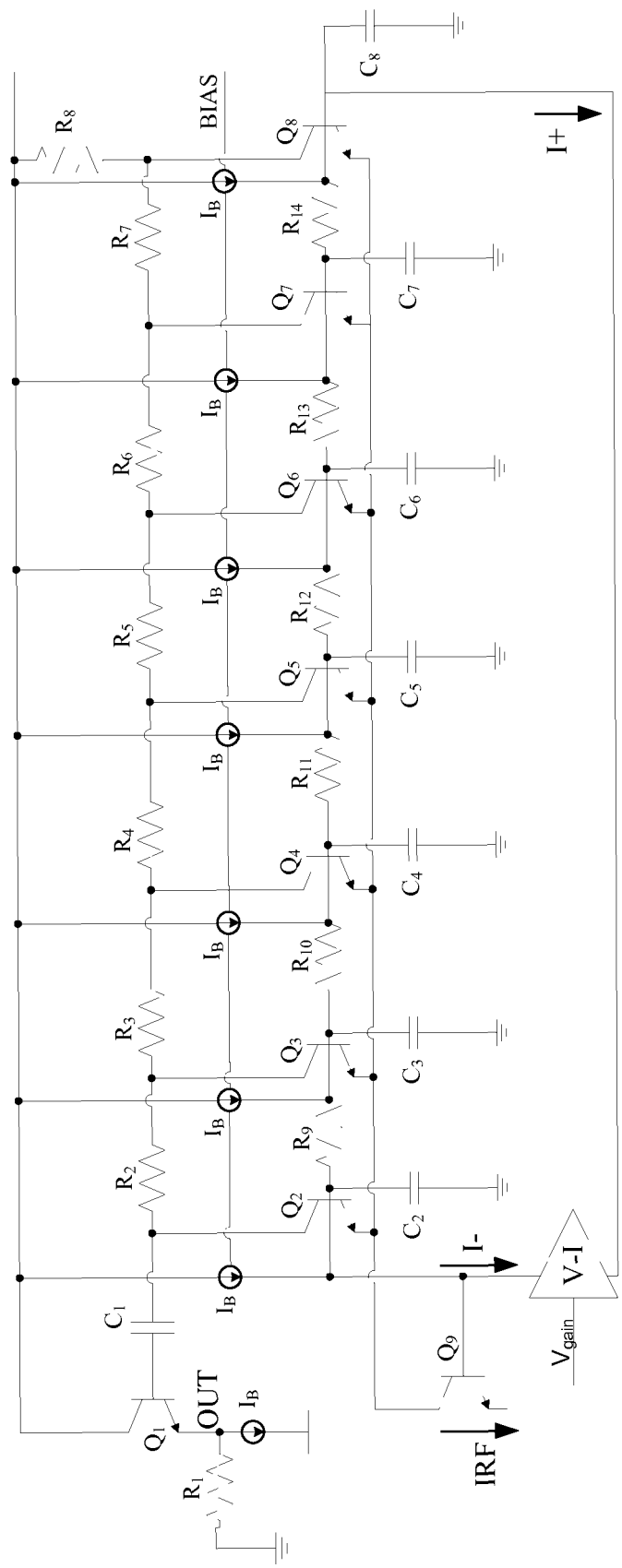
FIG. 2 shows a more detailed view embodiment of a variable gain up-converter at microwave frequencies.

FIG. 2 shows a more detailed implementation of a single-ended version of the VGA 12. At microwave frequencies, it is important to minimize parasitic elements, in particular capacitance. That is why the attenuator was chosen to be a tapered string attenuator (R2-R8). It is also necessary to decouple key nodes. The capacitors C2-C8 are important and decouple the bases of the "steering core/interpolator" since transistors Q2-Q8 function as cascodes to the mixer core while simultaneously providing the needed variable gain function. Through this dual usage one not only reduces potential wiring parasitics but also saves power and reduces the overall layout size. The output of the VGA is taken via AC coupling cap C1 and transistor Q1. Note that Q1 can also be a gain stage vs. a simple follower or be taken directly of-chip after C1 to load resistor R1.

Figure 3:
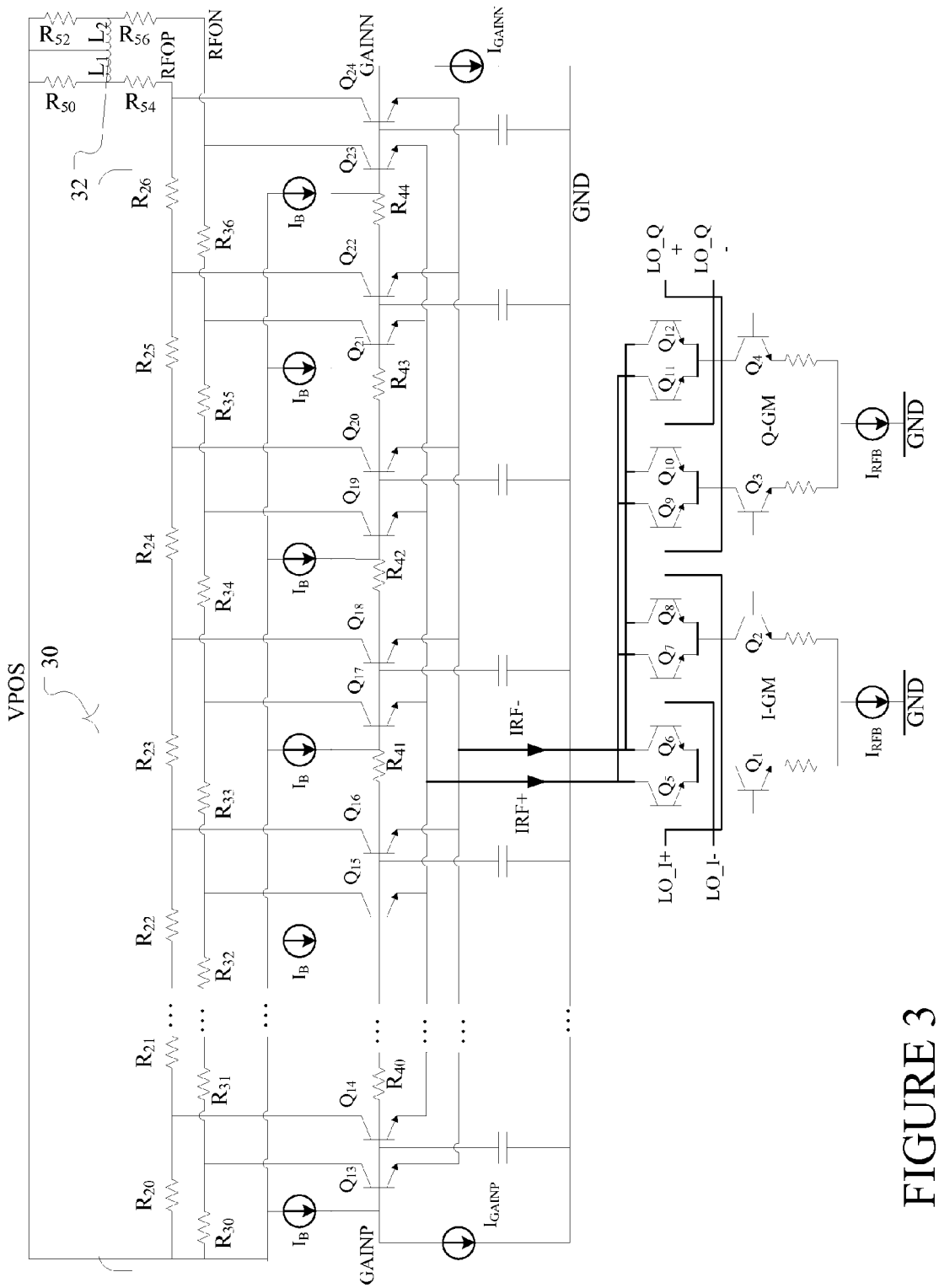
FIG. 3 shows a more detailed view of an embodiment of a variable gain up-converter at microwave frequencies.

FIG. 3 shows a more detailed embodiment of the differential implementation of the VGA having the differential integrated tapered string attenuator 30. As will be discussed with regard to FIG. 4, the network of resistors R20-R26 and R30-36 have values based upon the desired attenuation per tap of the attenuator, for example 3 dB/tap, and the desired termination resistor seen at the output nodes RFOP and RFON. In the tapered string attenuator where the resistance at the outputs are fixed, the smallest resistance will be R20 and R30 and the resistances will continue to increase from left to right in FIG. 3 with R21 being larger than R20, R22 larger than R21, etc. For example, at the largest attenuation setting, when the IRF+ and IRF− currents are injected into the taps between R20/R21 and R30/R31 to the far left of FIG. 3, one ends up with smaller resistor values that are larger in physical layout and increase the parasitic capacitance, but still results in higher bandwidth compared to the 0 dB point of the attenuator at RFOP and RFON with the largest tap resistance. This results in higher bandwidth at those nodes compared to nodes closer to the output.

The output of the attenuator is on the far right and has a potential secondary restraint of a required resistance if the output is unbuffered, for example, the resistance might need to be 50 ohms for return loss reasons. More attenuation may be needed, but more attenuation stages need to be added to the attenuator and this will result in more frequency roll off, because the signal has to traverse more resistor-capacitor (R-C) low pass filter (LPF) sections before reaching the output. By providing more bandwidth at larger attenuations, an overall −3 dB bandwidth can be reached for all gain settings that can be maintained near constant. Compare this to a ladder attenuator in which each tap produces the same R-C low pass function. In that case at low gains, when the signal has to traverse more of the attenuator, the bandwidth will be reduced significantly more due to the compounding of equal LPF sections vs. unequal LPF sections in the tapered string attenuator.

The attenuator may have many different attenuation-per-tap values. In one embodiment, the tap values are −3 dB per tap. The tapered string would then be implemented with tap resistor values $R_t$, FIG. 4, as seen looking towards VPOS of $Rt_{n+1}=R_1(\sqrt{2})^n$, where $R_1$ is the smallest resistor closest to VPOS. The values of the resistors in the string are $$R_{n+1}=R_1[(\sqrt{2})^n-(\sqrt{2})^{n-1}].$$

Figure 4:
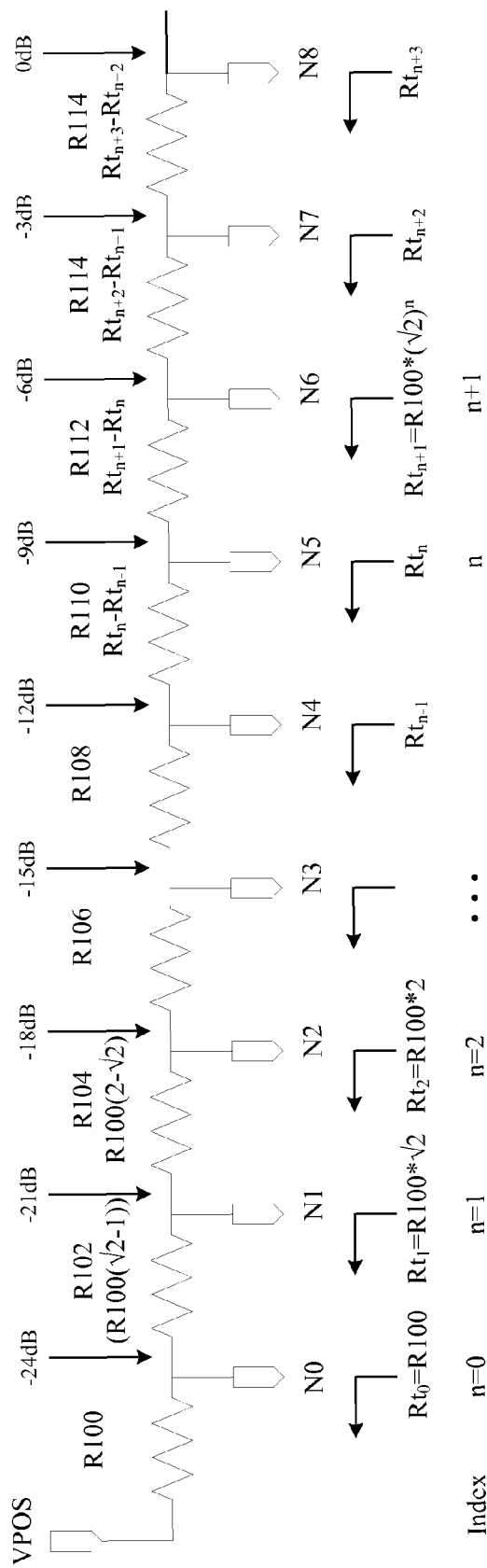
FIG. 4 shows an embodiment of a ladder network.

An example of such a tapered attenuator string is shown in FIG. 4. A table below shows the relationships between the various resistors.

| n | Node | Resistor | Tap Resistor Value ($Rt_n$) |
|---|------|----------|------------------------------|
| 0 | N0 | R100 = R100 | R100 |
| 1 | N1 | R102 = R100(√2 − 1) | R100 * √2 |
| 2 | N2 | R104 = R100(2 − √2) | R100 * 2 |
| 3 | N3 | R106 = R100(2√2 − 2) | R100 * 2√2 |
| 4 | N4 | R108 = R100(4 − 2√2) | R100 * 4 |
| 5 | N5 | R110 = R100(4√2 − 4) | R100 * 4√2 |
| 6 | N6 | R112 = R100(8 − 4√2) | R100 * 8 |
| 7 | N7 | R114 = R100(8√2 − 8) | R100 * 8(√2) |
| 8 = OUT | N8 | | R100 * 16 |

As mentioned above, this allows the attenuator to provide −3 dB per tap and be linear-in-dB with substantial power/signal levels, rather than linear-in-voltage as with other approaches. It also allows for high bandwidth output at the 0 dB point of the attenuator while minimizing parasitic capacitance as gain is changed.

Returning to FIG. 3, related to the maximum power/signal levels are the LRF, such as L1 and L2, inductors 32. These act as bias chokes and with the resistors in series help maintain the required output termination resistor value for matching reasons while allowing RFOP and RFON voltages to get closer to the supply rails, increasing the achievable signal swing. The addition of the inductors can also reduce the inherent broadband response. If the signal level is large enough for the given situation with just the resistors, one may not want to use the inductive bias chokes.

Other modifications and variations are of course possible. For a power efficient solution, the bias current from the baseband inputs to the mixer core to the RF VGA can be re-used as is shown in FIG. 3.

Stacking the high frequency transistors of the mixer core and the VGA on top of the baseband transistors can keep the transistors out of the breakdown region. High frequency transistors have very low breakdowns this makes them difficult to use when signal levels are large as can be the case in driver applications. One has to carefully manage the maximum expected voltages across the transistors, by stacking them not only is this very power efficient, but if biased properly, each transistor will only see a sub-range of the total supply and signal swings.

In this manner, the first linear-in-dB broadband VGA is provided that can operate at microwave frequencies. Even though the VGA described is used in an up-converter, one can easily turn this idea into a true microwave VGA by removing the mixer core and redesigning the baseband input GM stages into a microwave capable GM stage. This should be obvious to those skilled in the art.

It will be appreciated that several of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

What is claimed is:

1. A system for up-converting an incoming voltage signal, comprising:
    a baseband gain stage to receive incoming in-phase and quadrature voltage signals and output in-phase and quadrature current signals;
    a mixer core to receive the in-phase and quadrature current signals and output radio frequency signals, wherein the radio frequency signals include content between 6 GHz and 24 GHz; and
    a variable gain amplifier to receive the radio frequency signals and output a broadband radio signal, wherein the variable gain amplifier includes a tapered string attenuator.

2. The system of claim 1, wherein the variable gain amplifier further comprises an integrated interpolator.

3. The system of claim 1, wherein the tapered string attenuator has a constant attenuation-per-tap in dB.

4. The system of claim 1, further comprising a gain control module electrically coupled to the variable gain amplifier, wherein the gain control module is to output an analog output signal to the variable gain amplifier to control a gain of the variable gain amplifier.

5. The system of claim 1, wherein the baseband gain stage, the mixer core and the variable gain amplifier have a common bias current.

6. The system of claim 1, further comprising an output amplifier to receive the broadband radio signal and produce an amplified broadband radio signal.

7. The system of claim 1, wherein the variable gain amplifier has a response that is linear-in-dB.

8. The system of claim 1, further comprising an alternating current (AC) coupling capacitor coupled directly between an output of the variable gain amplifier and a load terminal.

9. The system of claim 1, wherein the tapered string attenuator comprises multiple stages, each providing a different low pass filter function.

10. The system of claim 1, wherein high frequency transistors of the variable gain amplifier are stacked with high frequency transistors of the mixer core to keep the high frequency transistors out of the breakdown region.

11. A system for up-converting an incoming baseband signal, comprising:
    a mixer core, comprising two double-balanced Gilbert cell mixers, to receive in-phase and quadrature signals and output a differential current signal; and
    a variable gain amplifier to receive the differential current signal and to output a differential radio frequency signal, wherein the variable gain amplifier includes an integrated interpolator and a tapered string attenuator.

12. The system of claim 11, further comprising an output buffer electrically coupled to the variable gain amplifier to receive the differential radio frequency signal and output a buffered differential radio frequency signal.

13. The system of claim 11, wherein the differential radio frequency signal includes content between 6 GHz and 24 GHz.

14. The system of claim 11, wherein the tapered string attenuator has a constant, non-unity, resistance-per-tap ratio between adjacent taps.

15. The system of claim 14, wherein to achieve an attenuation-per-tap ratio of X dB, the resistance-per-tap ratio is 10^(X/20) between adjacent taps.

16. The system of claim 11, further comprising a bias choke coupled between output signal lines of the variable gain amplifier.

17. A method for up-converting a baseband signal into a microwave signal, comprising:
   receiving in-phase and quadrature components of a baseband current signal at a mixer core, wherein the baseband current signal includes content between 0 GHz and 2 GHz;
   processing the in-phase and quadrature components at the mixer core to output a differential current signal; and
   providing the differential current signal to a variable gain amplifier, wherein the variable gain amplifier includes a tapered string attenuator through which the differential current signal is processed to output a microwave signal, and the microwave signal includes content between 6 GHz and 24 GHz.

18. The method of claim 17, wherein a gain of the variable gain amplifier is based at least in part on an analog gain control signal provided to the variable gain amplifier by a gain control module.

19. The method of claim 17, further comprising:
   outputting the microwave signal to a load without providing the microwave signal to an intermediate buffer.

20. The method of claim 17, further comprising:
   re-using a bias current from the mixer core for the variable gain amplifier.

21. The method of claim 17, further comprising:
   outputting the microwave signal from a 0 dB point of the tapered string attenuator.

* * * * *